(12) United States Patent
Tokuyama

(10) Patent No.: US 8,072,579 B2
(45) Date of Patent: Dec. 6, 2011

(54) MEASURING METHOD, ADJUSTMENT METHOD FOR STAGE MOVEMENT CHARACTERISTICS, EXPOSURE METHOD, AND DEVICE MANUFACTURING METHOD

(75) Inventor: Yusuke Tokuyama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 395 days.

(21) Appl. No.: 12/411,859

(22) Filed: Mar. 26, 2009

(65) Prior Publication Data

US 2009/0257045 A1     Oct. 15, 2009

(30) Foreign Application Priority Data

Apr. 15, 2008   (JP) .................. 2008-105837

(51) Int. Cl.
*G03B 27/68* (2006.01)
*G03B 27/52* (2006.01)
(52) U.S. Cl. .......................... 355/55; 355/52
(58) Field of Classification Search .......... 355/52, 355/53, 55, 67, 77; 356/399–401; 430/311
See application file for complete search history.

(56) References Cited

U.S. PATENT DOCUMENTS

| 6,563,565 B2 * | 5/2003 | Nishi ............................. 355/53 |
| 7,084,957 B2 | 8/2006 | Fukagawa ....................... 355/53 |
| 7,894,039 B2 * | 2/2011 | Miyashiro et al. ............. 355/53 |

FOREIGN PATENT DOCUMENTS

JP      2005-64268      3/2005

* cited by examiner

*Primary Examiner* — Hung Henry Nguyen
(74) *Attorney, Agent, or Firm* — Fitzpatrick, Cella, Harper & Scinto

(57) ABSTRACT

Provided is a measuring method including: transferring a measuring mark disposed on an original to a substrate at a plurality of locations; moving a substrate stage for holding the substrate so that the substrate is rotated by 90 degrees about a rotation axis parallel to an optical axis of a projection optical system; then transferring the measuring mark to the substrate at a plurality of locations so that the measuring mark overlaps the transfer region; measuring positional deviations among the transferred measuring marks and a first overlap mark in a region where the transfer regions overlap each other; and calculating at least one of a positional error of a shot on the substrate, a rotational error of the same, and an orthogonality in shot arrangement based on a result of the measurement.

8 Claims, 14 Drawing Sheets

MEASURING METHOD, ADJUSTMENT METHOD FOR STAGE MOVEMENT CHARACTERISTICS, EXPOSURE METHOD, AND DEVICE MANUFACTURING METHOD

BACKGROUND OF THE INVENTION

1. Field of the Invention

The present invention generally relates to a measuring method, an adjustment method for stage movement characteristics, an exposure method, and a device manufacturing method.

2. Description of the Related Art

When a device such as a semiconductor device is manufactured, multilayered circuit patterns are overlaid and transferred on a substrate. In this case, if different exposure apparatuses are used because different accuracies are required for the individual layers, overlap accuracy (matching accuracy) among the different exposure apparatuses is required.

Therefore, arrangement accuracy of a shot on the substrate when each exposure apparatus is used for the exposure is brought close to an ideal position, and hence the overlap accuracy among the different exposure apparatuses can be improved.

For this reason, a method of evaluating the arrangement accuracy of the shot is necessary. In a scanning exposure apparatus, for example, the arrangement accuracy of the shot is evaluated as described below.

As illustrated in FIG. 15, the transfer process is performed so that each of slit-like shots i is superimposed partially with other four shots j, k, l, and m.

In the superimposed region, as illustrated in FIG. 16, overlap marks 1 and 2 are formed by the shots i and j while overlap marks 3 and 4 are formed by the shots i and k.

Further, overlap marks 5 and 6 are formed by the shots i and l while overlap marks 7 and 8 are formed by the shots i and m.

Therefore, positional errors $\epsilon x$ and $\epsilon y$ and a rotational error $\epsilon \theta$ of each of the shots i, j, k, l, and m are calculated by using a least-square method from data obtained by measuring relative positions of the overlap marks 1 to 8 (see Japanese Patent Application Laid-Open No. 2005-064268).

However, the method described in the above-mentioned Japanese Patent Application Laid-Open No. 2005-064268 requires that sizes of the shots i, j, k, l, and m should be within the size of the slit. Therefore, the number of shots arranged in parallel to a short side direction of the shots i, j, k, l, and m increases, and hence it takes long time to perform the exposure and mark measurement.

SUMMARY OF THE INVENTION

Therefore, it is an object of the present invention to provide a method of measuring precision in shot arrangement on a substrate using a scanning exposure apparatus, thereby evaluating the precision in shot arrangement in shorter time.

According to one aspect of the present invention, provided is a method which measures precision in shot arrangement on a substrate by using an exposure apparatus for scanning an original and the substrate relatively so as to project a pattern of the original to the substrate via a projection optical system, the measuring method comprising: a first step of transferring a measuring mark disposed on the original to the substrate at a plurality of locations; a rotating step of moving a substrate stage which holds the substrate after performing the first step, so that the substrate is rotated by 90 degrees about a rotation axis that is parallel to an optical axis of the projection optical system; a second step of transferring the measuring mark to the substrate at a plurality of locations after performing the rotating step, so that the measuring mark overlaps a transfer region in the first step; a first measuring step of measuring positional deviations of first overlap marks in an overlap region where the transfer region in the first step overlaps a transfer region in the second step, the first overlap marks being overlaps between the measuring marks transferred in the first step and the measuring marks transferred in the second step; and a calculating step of calculating at least one of a positional error of a shot on the substrate, a rotational error of the same, and an orthogonality in shot arrangement based on a measurement result in the first measuring step.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Embodiments of the present invention will now be described in detail in accordance with the accompanying drawings.

Figure 1A:
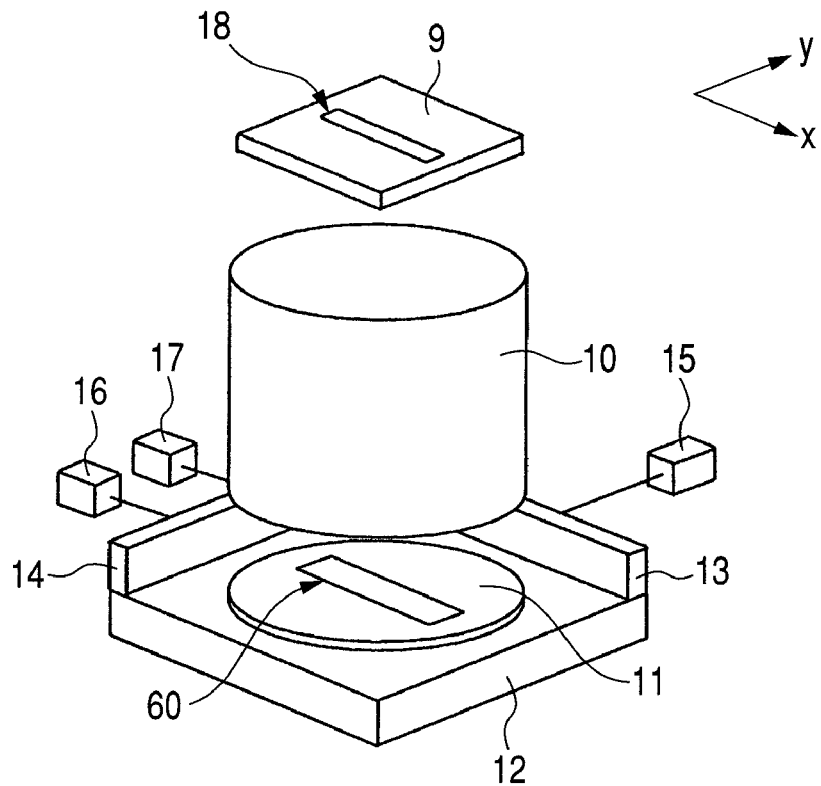
FIGS. 1A and 1B are general structural diagrams of a scanning exposure apparatus according to embodiments of the present invention.

A scanning exposure apparatus and an exposure method according to embodiments of the present invention are described with reference to FIG. 1.

The scanning exposure apparatus according to the embodiments of the present invention is an exposure apparatus for relatively scanning a reticle 9 as an original and a wafer 11 as a substrate so as to project a pattern of the reticle 9 to the wafer 11 via a projection lens 10 as a projection optical system. The reticle 9 as the original on which a predetermined pattern is plotted has a slit-like elongated irradiation area 18. An illumination optical system 22 emits illumination light to the irradiation area 18, and a part of a plotting pattern of the irradiated reticle 9 is transferred to a transfer region 60 on the wafer 11 as the substrate via the projection lens 10 as the projection optical system. A wafer stage 12 as a substrate stage holds the wafer 11 and is capable of moving on the x-y plane that is orthogonal to an optical axis of the projection lens 10. Laser interferometers 15, 16, and 17 are units for measuring a position and a rotation angle of the wafer stage 12. Reflecting mirrors 13 and 14 are fixed to the wafer stage 12 so as to be orthogonal to each other and reflect laser beams emitted from the laser interferometers 15, 16, and 17.

Figure 1B:
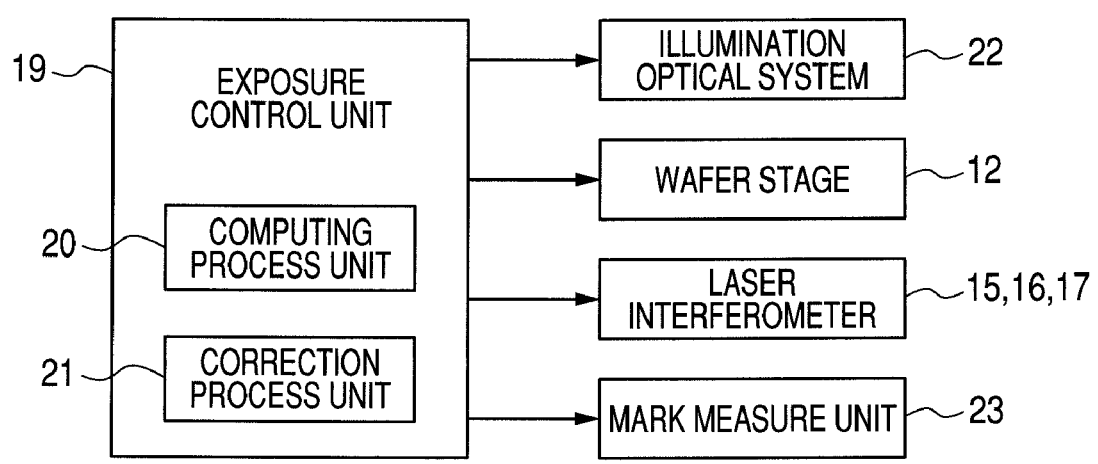

In addition, as illustrated in FIG. 1B, a mark measure unit 23 is a unit for measuring an overlap mark included in the slit-like elongated shot transferred onto the wafer 11.

Further, the exposure apparatus is equipped with an exposure control unit 19 for performing operations concerning the exposure such as moving the wafer stage 12 and emitting the illumination light from the illumination optical system 22, and computing process of measurement values obtained by the laser interferometers 15, 16, and 17. The exposure control unit 19 includes a computing process unit 20 and a correction process unit 21. The computing process unit 20 has a computing unit for computing a positional error and a rotational error of every shot transferred onto the wafer 11 as a unit based on a result of the measurement of the overlap mark by the mark measure unit 23. The correction process unit 21 has a correcting unit for correcting the positional error and the rotational error of the every shot computed by the computing process unit 20 to appropriate values, which are reflected on control by the exposure control unit 19.

Next, the measuring method for measuring a precision in shot arrangement on a substrate according to the embodiments of the present invention is a measuring method for measuring a precision in shot arrangement on the wafer 11 as the substrate by using the scanning exposure apparatus, and the method includes the steps described below.

In a first step, the measuring mark provided to the reticle 9 is transferred to a plurality of locations on the wafer 11.

Next, in a rotating step after performing the first step, the wafer stage 12 as the substrate stage for holding the wafer 11 is moved so that the wafer 11 is rotated by 90 degrees about a rotation axis that is parallel to the optical axis of the projection lens 10. By this rotation, a first shot transferred in the first exposure and a second shot transferred in the second exposure form a right angle in the plane that is orthogonal to the optical axis of the projection lens 10.

Next, in a second step after the rotating step, the measuring marks are transferred to a plurality of locations on the wafer 11 so that the measuring marks overlap the transfer region in the first step.

Next, in a first measuring step, within the region where the transfer region in the first step and the transfer region in the second step overlap each other, positional deviation of the first overlap marks, which are overlaps between the measuring marks transferred in the first step and the measuring marks transferred in the second step, is measured.

Next, in a calculating step, based on a result of the measurement in the first measuring step, at least one of the positional errors of the shot on the wafer 11, the rotational error thereof, and an orthogonality in shot arrangement is calculated.

In addition, the measuring method for measuring a precision in shot arrangement on a substrate according to the embodiments of the present invention is a measuring method for measuring a precision in shot arrangement on the wafer 11 as the substrate by using the scanning exposure apparatus, and the method includes the steps described below.

The first overlap marks are overlaps of a plurality of first long side marks aligned in parallel to a long side of the transfer region in the first step and of a plurality of second short side marks aligned in parallel to a short side of the transfer region in the second step.

Otherwise, the first overlap marks are overlaps of a plurality of first short side marks aligned in parallel to a short side of the transfer region in the first step and of a plurality of second long side marks aligned in parallel to a long side of the transfer region in the second step.

Figure 2:
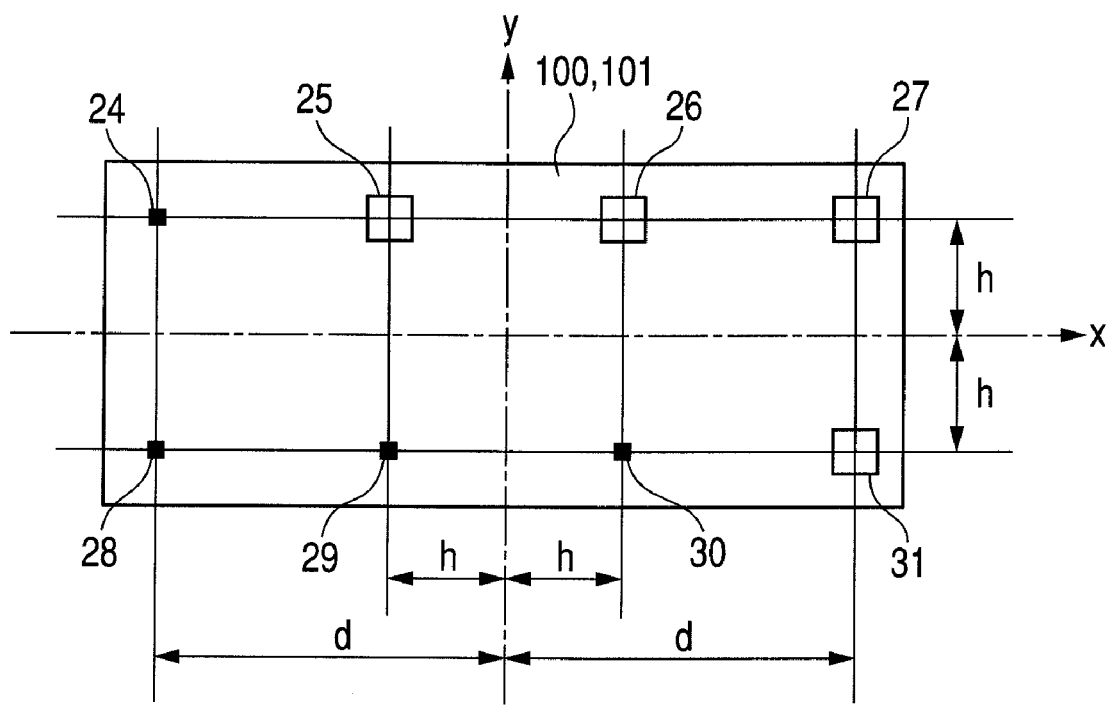
FIG. 2 is an explanatory diagram of a reticle pattern that is used in a first embodiment of the present invention.

According to the exposure apparatus of the embodiments of the present invention, a plurality of first shots 100 as pattern images of the elongated slit-like irradiation area 18 corresponding to the plotting pattern of the reticle 9 as illustrated in FIG. 2 are transferred onto the wafer 11 while the reticle 9 stays at a constant position. Marks 24, 25, 26, and 27, as well as marks 28, 29, 30, and 31 as the plurality of first long side marks are formed in the first shot 100 so that four marks are aligned in parallel to each of two long sides at constant intervals in the x direction. The marks 25, 26, 27, and 31 are hollow box marks while the mark 24, 28, 29, and 30 are solid box marks. Here, a distance between the marks 24 and 28, a distance between the marks 25 and 26, a distance between the marks 27 and 31, and a distance between the marks 29 and 30 have the same value "h+h".

In addition, the marks 25, 26, 29, and 30 are disposed at positions having a distance h in the x direction from a center (barycenter) position of the pattern image (i.e., intersection of the x axis and the y axis), while the marks 24, 27, 28, and 31 are disposed at positions having a distance d in the x direction from the same. In addition, the eight marks 24, 25, 26, 27, 28, 29, 30, and 31 are disposed at positions having the distance h in the y direction by fours symmetrically.

Figure 3A:
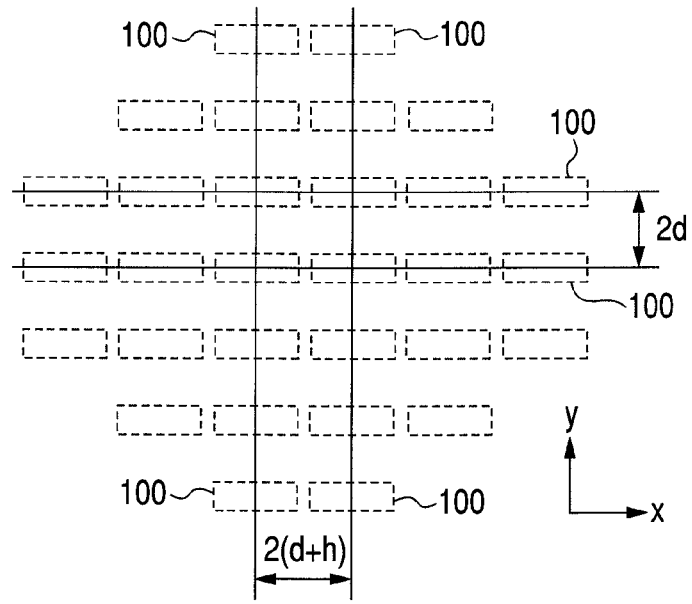
FIGS. 3A and 3B are general layout diagrams of shots according to the first embodiment of the present invention.

The pattern image is transferred on the wafer 11 in the first exposure in, for example, the shot arrangement as illustrated in FIG. 3A in which a plurality of first shots 100 are transferred on the wafer 11 at a pitch of 2(d+h) in the x direction and a pitch of 2d in the y direction.

In the above-mentioned step, the wafer 11 on which the pattern image is transferred is temporarily removed from an adsorption fixing stage on the wafer stage 12. Further, the wafer 11 is counterclockwise rotated from the fixed state of the wafer 11 in the first exposure by 90 degrees about the rotation axis that is the axis parallel to the optical axis of the projection lens 10 as the projection optical system and is attached again to the adsorption fixing stage on the wafer stage 12. As a result of this rotation operation, the shot 100 of the pattern image of the shot transferred on the wafer 11 has the arrangement illustrated by broken lines of FIG. 3B.

Figure 3B:
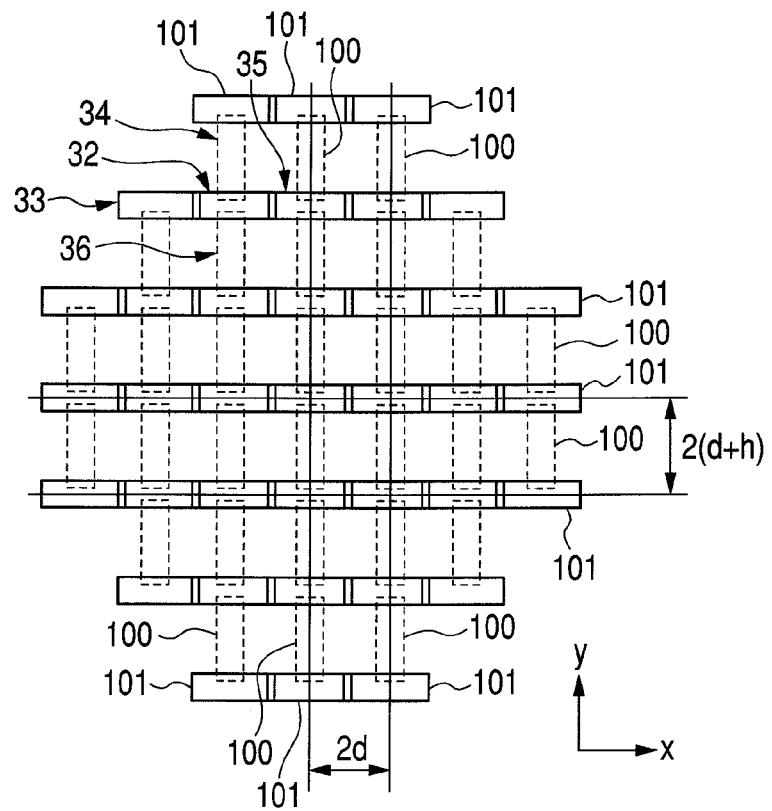

Next, after performing global alignment on the wafer 11, a second shot 101 is transferred in the second exposure onto the wafer 11 at a pitch 2d in the x direction and a pitch 2(d+h) in the y direction as illustrated by solid lines of FIG. 3B. As a result of that, the arrangement has a first overlap region between upper and lower parts of the first shot 100 having a vertically elongated shape transferred in the first exposure and the second shot 101 having a horizontally elongated shape transferred in the second exposure. In this shot arrangement, the second shot 32 transferred in the second exposure forms superimposed regions on the left and right short sides together with the second shots 33 and 35 transferred in the second exposure.

In addition, the second shot 32 forms the first overlap region so that parts of the upper and lower long sides overlap with the short sides of the first shots 34 and 36 transferred in the first exposure. In addition, all of the shots 101 transferred in the second exposure each form the first overlap region together with at least one adjacent shot 101 transferred in the second exposure and with at least one shot 100 transferred in the first exposure.

Figure 4:
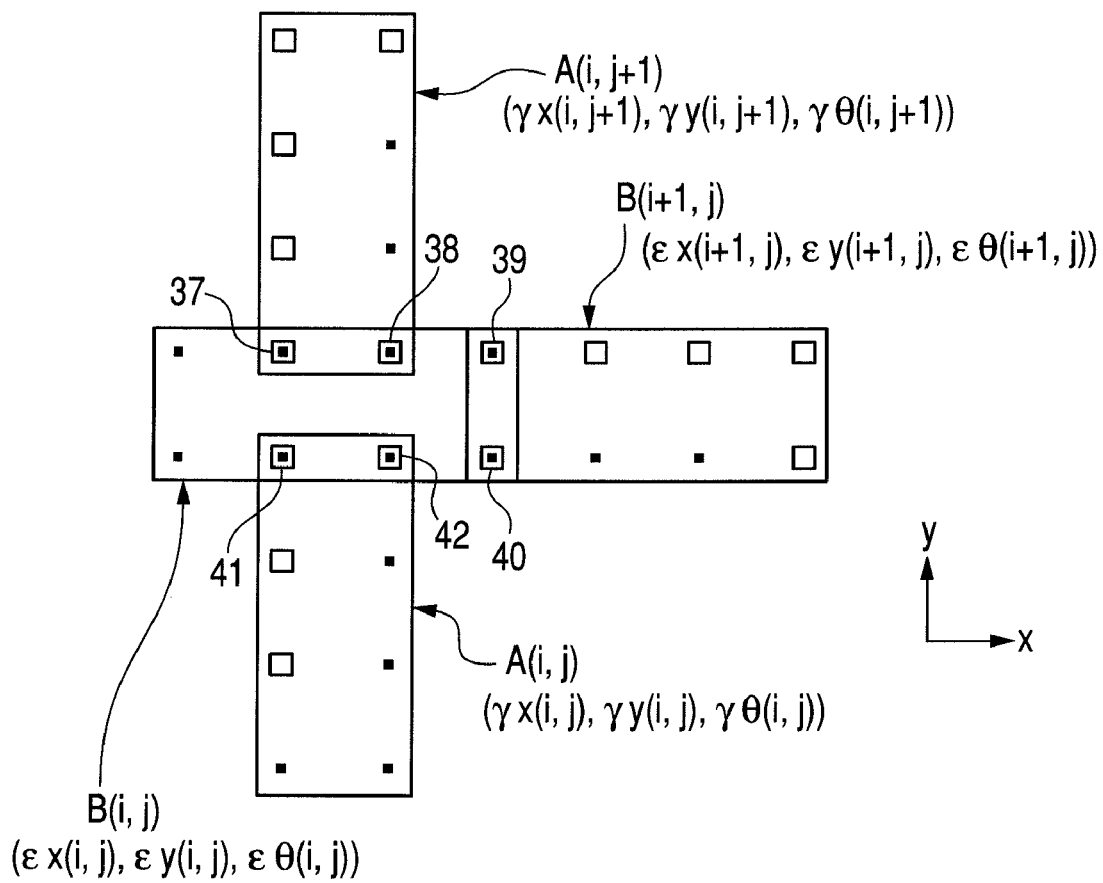
FIG. 4 is a partial enlarged diagram of a shot arrangement according to the first embodiment of the present invention.

The first overlap marks 37, 38, 41, and 42 between the first shot A and the second shot B illustrated in FIG. 4 are overlaps between the plurality of first short side marks 24 and 28; 27 and 31 that are aligned in parallel to the short side of the first shot 100 and the plurality of second long side marks 24, 25, 26, and 27: 28, 29, 30, and 31 that are aligned in parallel to the long side of the second shot 101. The mark measure unit 23 measures relative distances of the overlap marks in the superimposed region formed as described above, and the computing process unit 20 computes positional errors and rotational errors of all the shots 100 and 101 transferred onto the wafer 11 as a unit as described below.

In addition, the measuring method for measuring a precision in shot arrangement on a substrate according to the embodiments of the present invention includes the steps described below.

In a second measuring step, within the overlap region between the transfer regions in the first step or between the transfer regions in the second step, a positional deviation of second overlap marks, which are overlaps between the measuring marks transferred in the first step or overlaps between the measuring marks transferred in the second step, is measured.

Further, at least one of the positional errors of the shot on the wafer 11, the rotational error thereof, and the orthogonality in shot arrangement is calculated based on a result of the first measuring step and a result of the second measuring step.

As illustrated in FIGS. 3A and 3B and 4, the second overlap marks 39 and 40 are measured within the second overlap region between the second shots, i.e., the second overlap region between the second shots 101 and 101 shown in FIGS. 3A and 3B (B and B shown in FIG. 4) so that the result of the second measuring step is obtained.

Further, in addition to the result of the first measuring step, at least one of the positional error of all the first shot and the second shot, the rotational error thereof, and the orthogonality in shot arrangement is calculated based on the result of the second measuring step.

Further, the second overlap marks are overlaps of a plurality of second short side marks aligned in parallel to a short side of the transfer region in the second step and of a plurality of second short side marks of the other second shot aligned in parallel to the short side so as to be opposed to the plurality of second short side marks.

Among the second overlap marks illustrated in FIG. 4, the second overlap marks that are superimposed with the shot B(i+1, j) neighboring the shot B(i, j) and B(i, j) are the overlap marks 39 and 40.

The second overlap marks are overlaps of a plurality of second short side marks 24 and 28: 27 and 31 aligned in parallel to the short side of the second shot 101 illustrated in FIG. 2 and of a plurality of second short side marks of the other second shot 101 aligned in parallel to the short side so as to be opposed to the plurality of second short side marks 24 and 28: 27 and 31.

As to the first overlap marks 37, 38, 41, and 42, barycenter positions ($dx1(i, j)$, $dy1(i, j)$), ($dx2(i, j)$, $dy2(i, j)$), ($dx3(i, j)$, $dy3(i, j)$), ($dx4(i, j)$, $dy4(i, j)$) of the hollow box marks are measured with respect to barycenter positions of the solid box marks in the x axis direction and in the y axis direction.

In addition, as to the second overlap marks 39 and 40 which are overlaps of the shots B(i, j) and B(i+1, j) adjacent to B(i, j), barycenter positions ($dx5(i, j)$, $dy5(i, j)$) and ($dx6(i, j)$, $dy6(i, j)$) of the solid box marks are measured with respect to barycenter positions of the hollow box marks in the x axis direction and in the y axis direction, respectively.

Hereinafter, for the second shots B(i, j), the positional errors in the x-axis and y-axis directions are represented by $\epsilon x(i, j)$, $\epsilon y(i, j)$ and the rotational errors about the z axis is represented by $\epsilon\theta(i, j)$. For the first shots A(i, j), the positional errors in the x-axis and y-axis directions are represented by $\gamma x(i, j)$, $\gamma y(i, j)$ and the rotational errors about the z axis is represented by $\gamma\theta(i, j)$.

In addition, errors in the x-axis and y-axis directions that are unique to the individual overlap marks as constant values, each of which is generated by a distortion of a projection image of the reticle 9 or by a stage drive scale, are represented by ($\delta x1$, $\delta y1$), ($\delta x2$, $\delta y2$), ($\delta x3$, $\delta y3$), ($\delta x4$, $\delta y4$), ($\delta x5$, $\delta y5$) and ($\delta x6$, $\delta y6$) for the respective overlap marks 37, 38, 41, 42, 39 and 40.

Further, irregular errors in the x-axis and y-axis directions such as a round-off error generated in the measurement of the first and second overlap marks are represented by ($\zeta x1(i, j)$, $\zeta y1(i, j)$), ($\zeta x2(i, j)$, $\zeta y2(i, j)$), ($\zeta x3(i, j)$, $\zeta y3(i, j)$), ($\zeta x4(i, j)$, $\zeta y4(i, j)$), ($\zeta x5(i, j)$, $\zeta y5(i, j)$), and ($\zeta x6(i, j)$, $\zeta y6(i, j)$) for the respective overlaps marks 37, 38, 41, 42, 39 and 40. Then, the relationships of the equations (1) to (12) below are satisfied.

$$dx1(i,j)=\epsilon x(i,j)-h\epsilon\theta(i,j)-\gamma x(i,j+1)-d\gamma\theta(i,j+1)+\delta x1+\zeta x1(i,j) \quad (1)$$

$$dx2(i,j)=\epsilon x(i,j)-h\epsilon\theta(i,j)-\gamma x(i,j+1)-d\gamma\theta(i,j+1)+\delta x2+\zeta x2(i,j) \quad (2)$$

$$dx3(i,j)=\gamma x(i,j)-d\gamma\theta(i,j)-\epsilon x(i,j)-h\epsilon\theta(i,j)+\delta x3+\zeta x3(i,j) \quad (3)$$

$$dx4(i,j)=\gamma x(i,j)-d\gamma\theta(i,j)-\epsilon x(i,j)-h\epsilon\theta(i,j)+\delta x4+\zeta x4(i,j) \quad (4)$$

$$dx5(i,j)=\epsilon x(i,j)-h\epsilon\theta(i,j)-\epsilon x(i+1,j)+h\epsilon\theta(i+1,j)+\delta x5+\zeta x5(i,j) \quad (5)$$

$$dx6(i,j)=\epsilon x(i,j)+h\epsilon\theta(i,j)-\epsilon x(i+1,j)-h\epsilon\theta(i+1,j)+\delta x6+\zeta x6(i,j) \quad (6)$$

$$dy1(i,j)=\epsilon y(i,j)-h\epsilon\theta(i,j)-\gamma y(i,j+1)+h\gamma\theta(i,j+1)+\delta y1+\zeta y1(i,j) \quad (7)$$

$$dy2(i,j)=\epsilon y(i,j)+h\epsilon\theta(i,j)-\gamma y(i,j+1)-h\gamma\theta(i,j+1)+\delta y2+\zeta y2(i,j) \quad (8)$$

$$dy3(i,j)=\gamma y(i,j)-h\gamma\theta(i,j)-\epsilon y(i,j)+h\epsilon\theta(i,j)+\delta y3+\zeta y3(i,j) \quad (9)$$

$$dy4(i,j)=\gamma y(i,j)+h\gamma\theta(i,j)-\epsilon y(i,j)-h\epsilon\theta(i,j)+\delta y4+\zeta y4(i,j) \quad (10)$$

$$dy5(i,j)=\epsilon y(i,j)+d\epsilon\theta(i,j)-\epsilon y(i+1,j)+d\epsilon\theta(i+1,j)+\delta y5+\zeta y5(i,j) \quad (11)$$

$$dy6(i,j)=\epsilon y(i,j)+d\epsilon\theta(i,j)-\epsilon y(i+1,j)+d\epsilon\theta(i+1,j)+\delta y6+\zeta y6(i,j) \quad (12)$$

In the above equations (1) to (12), the number of vertically elongated shots that are fully equipped by all the overlap marks is denoted by Na.

In contrast, the number of horizontally elongated shots related to formation of the overlap marks is denoted by Nb. Then, a total number of the shots is Na+Nb. Since the positional deviations with respect to three directions including the x direction, the y direction, and the θ direction are unknown for each shot, the number of unknown quantities is 3(Na+Nb)+12, which is the sum of the above-mentioned number plus the number of errors unique to the individual overlap marks.

On the other hand, the number of equations is determined as follows.

The number of overlap marks as overlaps between the vertically elongated shot and the horizontally elongated shot is 4Na.

In addition, letting the number of rows in the arrangement of the horizontally elongated shots be Rb, the number of overlap marks as overlaps between the horizontally elongated shots neighboring each other is 2(Nb−Rb). Since measurement values in the x direction and in the y direction are obtained for each overlap mark, the number of measurement values of the overlap marks is 8Na+4(Nb−Rb). Since one equation holds for one measurement value of the overlap mark, the number of equations related to all the measurement values is 8Na+4(Nb−Rb).

Here, if attempting to solve all the unknowns by using the above equations, they become indeterminate simultaneous equations and cannot be solved. Therefore, it is necessary to determine average values of the positional errors $\gamma x(i, j)$ and $\gamma y(i, j)$ and the rotational error $\gamma\theta(i, j)$ of the vertically elongated shot, the arrangement inclinations in the x direction and in the y direction, the arrangement scale error, or the average values of the positional errors $\epsilon x(i, j)$ and $\epsilon y(i, j)$ and the rotational error $\epsilon\theta(i, j)$ of the horizontally elongated shot to be constant values.

Therefore, ten equations (13) to (22) are added as follows.

$$\Sigma\gamma x(i,j)=0 \quad (13)$$

$$\Sigma\gamma y(i,j)=0 \quad (14)$$

$$\Sigma\gamma\theta(i,j)=0 \quad (15)$$

$$\Sigma X\gamma(i,j)\gamma x(i,j)=0 \quad (16)$$

$$\Sigma Y\gamma(i,j)\gamma y(i,j)=0 \quad (17)$$

$$\Sigma X\gamma(i,j)\gamma y(i,j)=0 \quad (18)$$

$$\Sigma Y\gamma(i,j)\gamma x(i,j)=0 \quad (19)$$

$$\Sigma\epsilon x(i,j)=0 \quad (20)$$

$$\Sigma\epsilon y(i,j)=0 \quad (21)$$

$$\Sigma\epsilon\theta(i,j)=0 \quad (22)$$

Here, Σ denotes a total sum of matrix numbers (i, j) of all the shots to be determined about the arrangement in each of the vertically elongated shots and the horizontally elongated shots. In addition, $X\gamma(i, j)$ and $Y\gamma(i, j)$ denote coordinate positions of the wafer 11 at the center of the shot A(i, j), which is adjusted so that a total sum of all the shots 100 transferred in the first exposure becomes zero.

In the equation (13), a total shift amount of the vertically elongated shot in the x direction is defined to be zero.

In the equation (14), a total shift amount of the vertically elongated shot in the y direction is defined to be zero.

In the equation (15), a total rotational error of the vertically elongated shot is defined to be zero.

In the equation (16), an arrangement scale error of the vertically elongated shot in the x direction is defined to be zero.

In the equation (17), an arrangement scale error of the vertically elongated shot in the y direction is defined to be zero.

In the equation (18), an arrangement inclination of the vertically elongated shot with respect to the x axis is defined to be zero.

In the equation (19), an arrangement inclination of the vertically elongated shot with respect to the y axis is defined to be zero.

In the equation (20), a total shift amount of the horizontally elongated shot in the x direction is defined to be zero.

In the equation (21), a total shift amount of the horizontally elongated shot in the y direction is defined to be zero.

In the equation (22), a rotational error of the horizontally elongated shot is defined to be zero.

As a result, the number of equations represented by the equations (1) to (22) becomes 8Na+4(Nb−Rb)+10. In addition, as described above, there are total (3(Na+Nb)+12) of unknowns in the simultaneous equations. Here, a column vector of (3(Na+Nb)+12) rows made up of all (3(Na+Nb)+12) of unknowns is denoted by u.

Further, a column vector of (8Na+4(Nb−Rb)+10) rows made up of (8Na+4(Nb−Rb)+10) of known numbers including right-hand sides of the equations (13) to (22) is denoted by d. Then, the simultaneous equations to be solved can be expressed by using a matrix M as the equation (23).

$$d=Mu \quad (23)$$

Here, the matrix M is a matrix having (8Na+4(Nb−Rb)+10) rows and (3(Na+Nb)+12) columns.

When the equations (24) and (25) described below hold simultaneously, the unknowns can be determined uniquely by substituting zero to all the irregular errors such as $\zeta x1(i, j)$.

$$\text{rank}(M)=\text{rank}(M, d) \quad (24)$$

$$\text{rank}(M)=3(Na+Nb)+1 \quad (25)$$

When the equations (26) and (27) described below hold simultaneously, the unknowns can be determined by using the least-square method so that a sum of squares of the irregular errors such as $\zeta x1(i, j)$ is minimized.

$$\text{rank}(M)<\text{rank}(M, d) \quad (26)$$

$$\text{rank}(M)=3(Na+Nb)+12 \quad (27)$$

Here, rank(M) of the equations (24) to (26) represents a rank of matrix M, and a matrix (M, d) of the equations (24) and (26) represents an augmented matrix.

When the computing process unit 20 performs a batch computing process by using a mathematical computing unit as described above, the relative positional error and the relative rotational error of all the shots 100 and 101 transferred onto the wafer 11 can be calculated.

Figure 5:
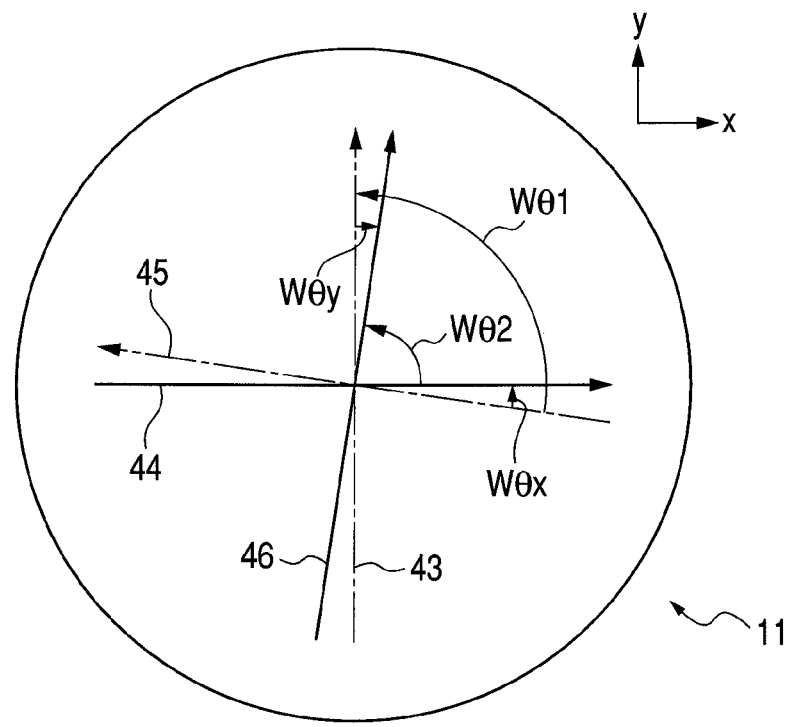
FIG. 5 is a conceptual diagram of determining an orthogonality in shot arrangement in the first embodiment of the present invention.

Next, the following directions are defined as illustrated in FIG. 5.

An arrangement direction 43 of the vertically elongated shot is the direction on the wafer 11, which is formed when the wafer stage 12 is driven in the x direction in the first exposure. An arrangement direction 44 of the vertically elongated shot is the direction which is formed when the wafer stage 12 is driven in the y direction.

An arrangement direction 45 of the horizontally elongated shot is the direction which is formed when the wafer stage 12 is driven in the x direction in the second exposure. An arrangement direction 46 of the horizontally elongated shot is the direction which is formed when the wafer stage 12 is driven in the y direction. The wafer coordinates $(X\epsilon(i, j), Y\gamma(i, j))$ of the shot 101 is defined for each of the shots 101 transferred in the second exposure. Then, a relative angle Wθx between a straight line 44 and a straight line 45 can be determined by a regression line determined by using Xε(i, j) and a positional error εy(i, j) in the y direction.

In the same manner, a relative angle Wθy between a straight line 43 and a straight line 46 can be determined by using Yγ(i, j) and the positional error εy(i, j) in the y direction.

In addition, orthogonality Wθ1 in shot arrangement formed by the vertically elongated shots and orthogonality Wθ2 in shot arrangement formed by the horizontally elongated shots are defined on the wafer 11. Then, the equation (28) holds.

$$W\theta 1 = W\theta 2 - W\theta y + W\theta x \quad (28)$$

The drive directions in the x direction and the y direction of the wafer stage 12 are not changed between the first exposure and the second exposure, and thus the equation (29) holds.

$$W\theta 1 + W\theta 2 = \pi \quad (29)$$

By handling the equations (28) and (29) as simultaneous equations, Wθ2 is determined as the equation (26).

$$W\theta 2 = 1/2(W\theta y - W\theta x + \pi) \quad (30)$$

By performing the computing process as described above, the computing process unit 20 can determine deviation of the angle between the moving direction in the x direction and the moving direction in the y direction of the stage, i.e., the orthogonality in shot arrangement.

If the calculation is performed based on a result thereof, the above-mentioned shot positional error includes information of the orthogonality in shot arrangement. The correction process unit 21 corrects the all shot positional errors and rotational errors computed by the computing process unit 20 to be appropriate values as the method described later, which are reflected on the control performed by the exposure control unit 19, e.g., movement control (position correction) of the wafer stage 12.

The positional errors and the rotational errors of the shot obtained by the above-mentioned step are discrete measurement values corresponding to drive positions of the wafer stage 12. In order to reflect the positional errors and the rotational errors on the movement control of the wafer stage 12, it is necessary to generate continuous correction values with respect to the drive positions of the wafer stage 12.

Next, the adjustment method of stage movement characteristics according to the embodiments of the present invention includes correcting movement characteristics of the wafer stage 12 for holding the wafer 11 based on the result of the measurement by the measuring method.

Here, a method of generating the continuous correction values is described.

If error is included in a degree of parallelization between the optical axes of the interferometers 16 and 17, a posture about the z axis (rotation angle) varies in proportion to the drive distance in the x axis direction when the wafer stage 12 is driven in the x axis direction. In addition, if error is included in the orthogonality of mirror surface of the reflecting mirrors 13 and 14, an error of the same amount as the above-mentioned error occurs in orthogonality of a drive shaft because the wafer stage 12 is driven in parallel with the mirror surfaces of the reflecting mirrors 13 and 14. The rotation angle error and the orthogonality error are linear to the drive position on the wafer stage 12 in principle. Therefore, linear and continuous correction values are generated in accordance with drive positions of the wafer stage 12. In addition, because of flatness of the mirror surfaces of the reflecting mirrors 13 and 14, an error occurs in linearity of the drive shaft by the same amount as the flatness of each reflecting mirror when the wafer stage 12 is driven in the x axis direction and in the y axis direction. The x axis linearity due to this reason is common to every y coordinate. Similarly, the y axis linearity is common to every x coordinate. Therefore, the x axis linearity can be calculated by averaging positional deviation values of all y coordinates in the y direction while the y axis linearity can be calculated by averaging positional deviation values of all x coordinates in the x direction. The x axis linearity and the y axis linearity due to the flatnesses of the reflecting mirrors 13 and 14 calculated in this manner are a discrete data series about the positional error. However, as to the region without data, the continuous correction value can be calculated by connecting two continuous points of the measurement values with a straight line or by curve approximation of a plurality of points of the measurement values.

The linear rotational error, the orthogonality error, the x axis (or y axis) linearity that is common to the y coordinates (or x coordinates) of the wafer stage 12 described above are caused by the degree of parallelization of the interferometers 16 and 17, the orthogonalities of the reflecting mirrors 13 and 14, and the flatnesses of the reflecting mirrors 13 and 14, respectively. Therefore, correction is necessary unless accuracy of attachment and accuracy of finishing of the structural components are higher than or equal to accuracy of measurement of the embodiments of the present invention. Factors other than the causes described above may affect positional error or the rotational error of the shot. More specifically, the degree of parallelization in the xy plane of the interferometers 16 and 17, the orthogonalities and flatnesses of the reflecting mirrors 13 and 14, the relative distance relationship between the reflecting mirror 13, 14 and the exposure position on the wafer 11 may change in correlation with the drive position of the wafer stage 12 due to a certain cause. Also in this case, the correction can be performed in consideration of the measurement result of the embodiments of the present invention. If the positional error or the rotational error of the shot varies in correlation with both the x coordinate and the y coordinate, the continuous correction value can be calculated by using flat plane approximation.

In the series of the flow described above, the series of operation from the first exposure to the reflection of the correction value is performed in the software control automatically by using a so-called latent image resist for the wafer 11 which generates the pattern image automatically without the developing step after the exposure. Note that a resist made of a dissolution inhibitor such as diazonaphthoquinone or a novolac resin, a chemically-amplified resist made of a novolac resin, a polyvinyl phenol resin, a polyacrylic resin, or the like and a photo-acid-generating agent, or the like can be used as the resist described above.

As described above, according to the embodiments of the present invention, a positional error and a rotational error of the shot can be measured in a short time. In addition, corrections of the linearity and the rotational error of the wafer stage 12 are performed appropriately in accordance with the position of the wafer stage 12 based on the above-mentioned measurement result, and the adjustment for enhancing the matching accuracy can be performed in a short time, whereby the time necessary for manufacturing the semiconductor device can be further shortened.

Note that in the first embodiment described above, a plurality of shots 100 is transferred before a plurality of shots 101 is transferred. However, the order of the transferring the shots 100 and 101 can be reversed. That is, a plurality of shots 101 can be transferred before a plurality of shots 100 is transferred.

Figure 7:
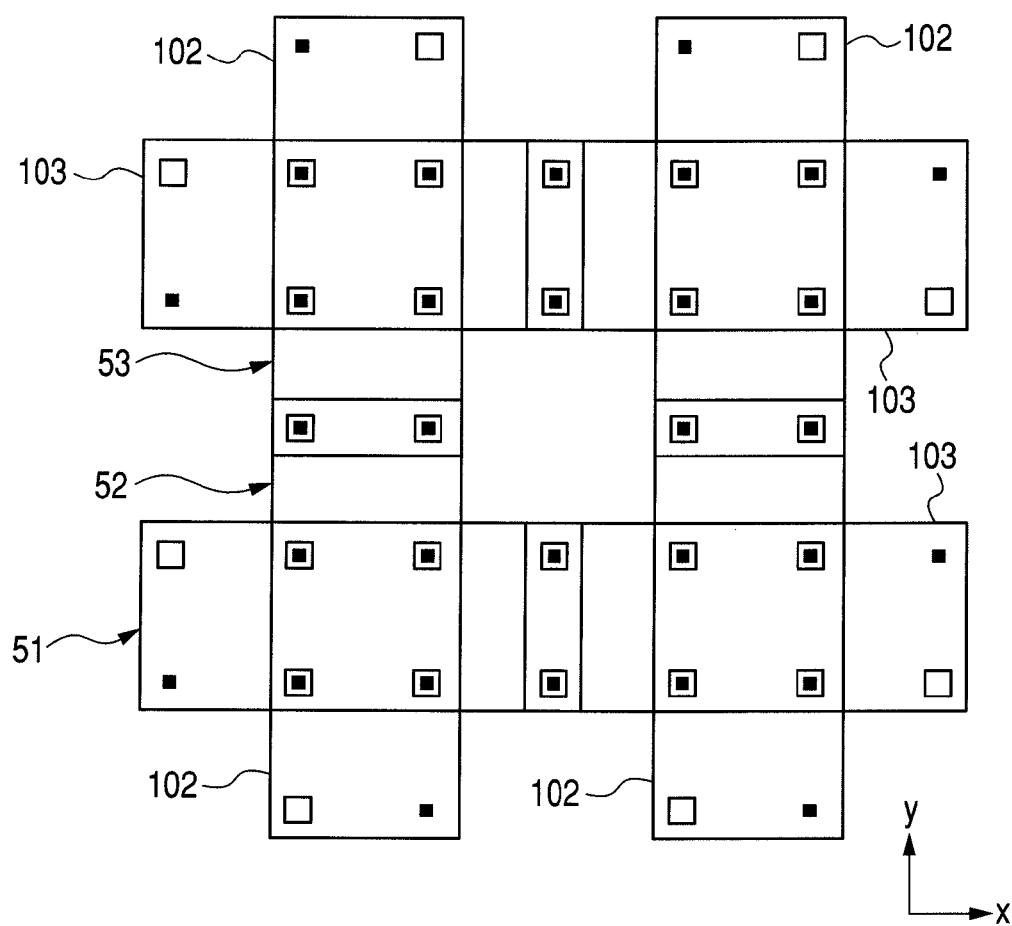
FIG. 7 is a partial enlarged diagram of a shot arrangement according to the second embodiment of the present invention.
Figure 8:
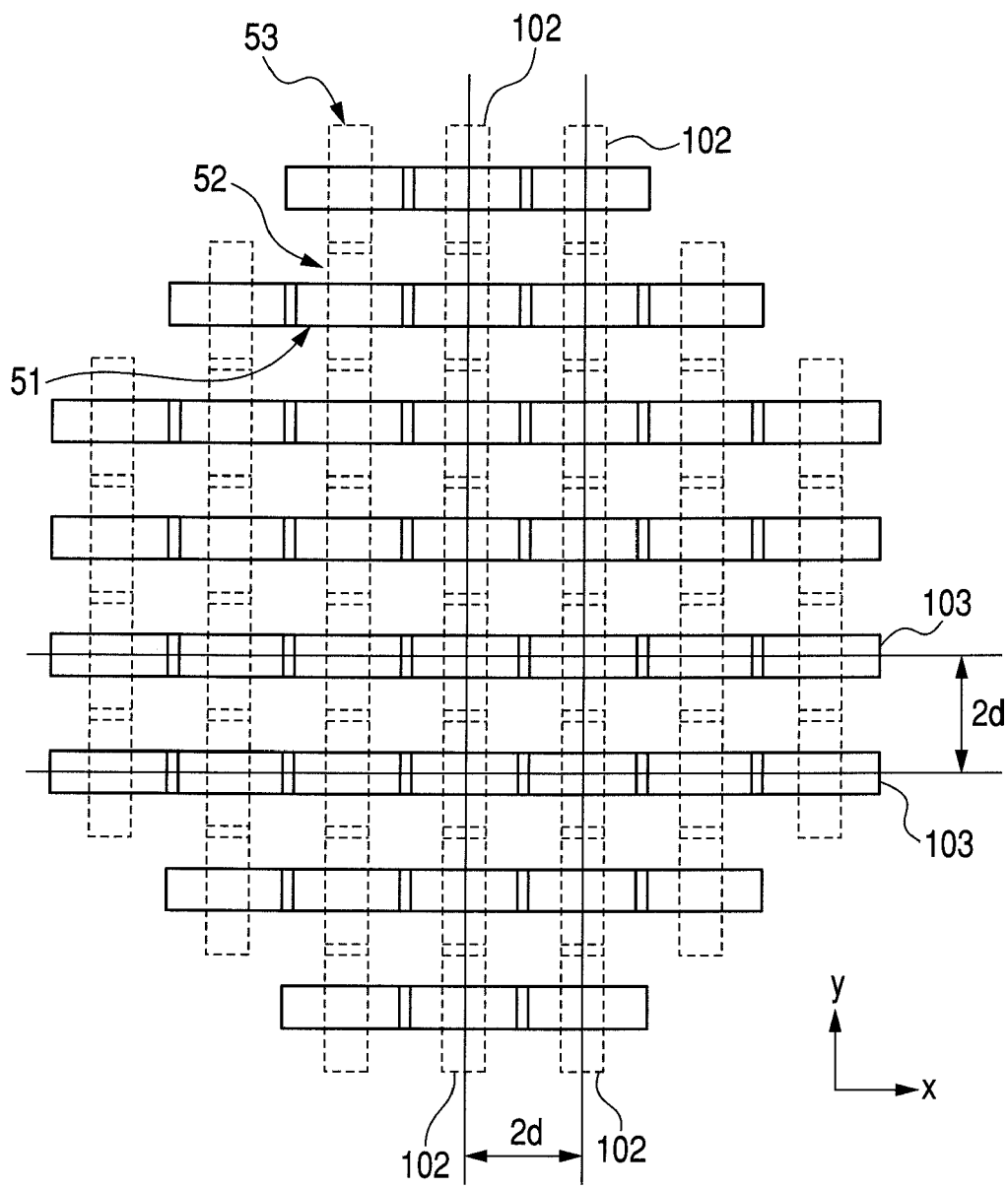
FIG. 8 is a general layout diagram of shots according to the second embodiment of the present invention.

Next, a second embodiment according to the present invention is described with reference to FIGS. 6, 7, and 8.

Figure 6:
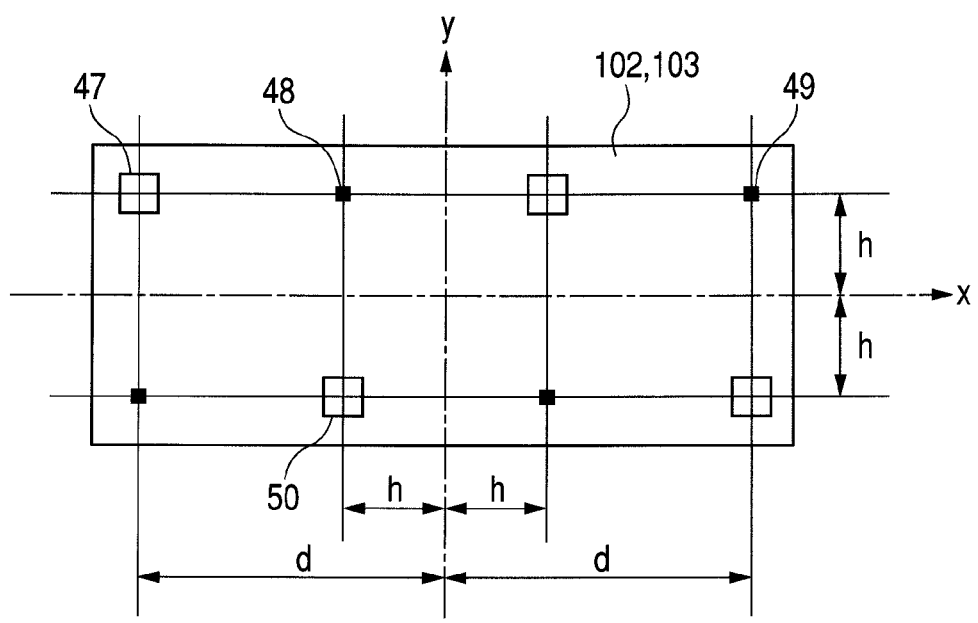
FIG. 6 is an explanatory diagram of a reticle pattern that is used in a second embodiment of the present invention.

In the second embodiment, there is used a shot 102 of the pattern image in which the hollow box mark and the solid box mark are changed without changing the arrangement locations of the marks as for marks 47, 48, 49, and 50 illustrated in FIG. 6, with respect to the shot 100 of the pattern image illustrated in FIG. 2. In addition, as illustrated in FIGS. 7 and 8, a step width in the arrangement of the shots 102 and 103 in the x direction and the y direction are both set to be 2d in each of the first exposure and the second exposure. In this case, as illustrated in FIG. 7, a shot 51 transferred in the second exposure crosses a shot 52 transferred in the first exposure so that a superimposed region is formed. The shots 52 and 53 transferred in the first exposure form a superimposed region with each short side. This means that the step widths of the shots 102 and 103 in the x direction and the y direction are both 2d in each of the first exposure and the second exposure. Therefore, if the step width of the shot arrangement to be determined is the same constant value in the x direction and the y direction, data for two times can be obtained in the step width, whereby more accurate measurement and correction can be performed.

Further, not only the step width but also the layout of the shots 102 and 103 can be completely the same between the first exposure and the second exposure, and thus more accurate measurement and correction can be expected when the shot arrangement in a layout of a particular shot is determined.

Figure 10:
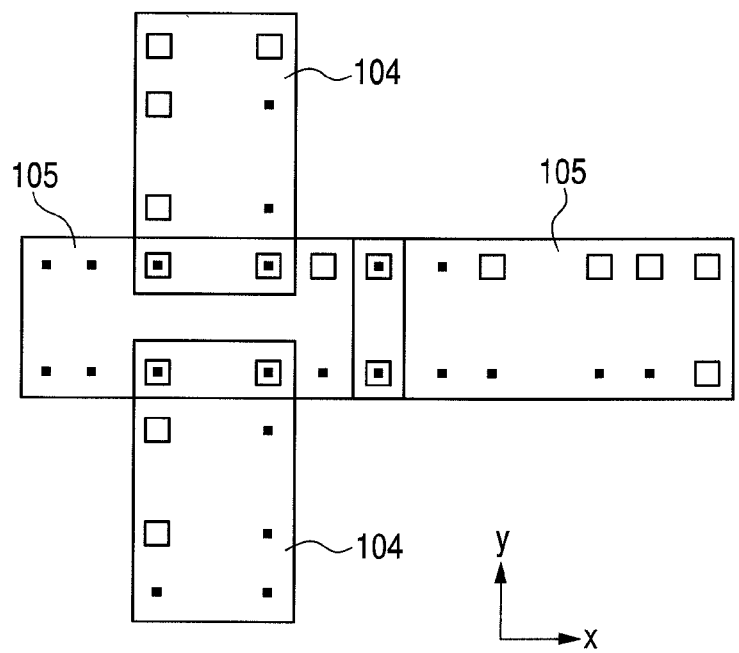
FIG. 10 is a partial enlarged diagram of a shot arrangement according to the third embodiment of the present invention.
Figure 11:
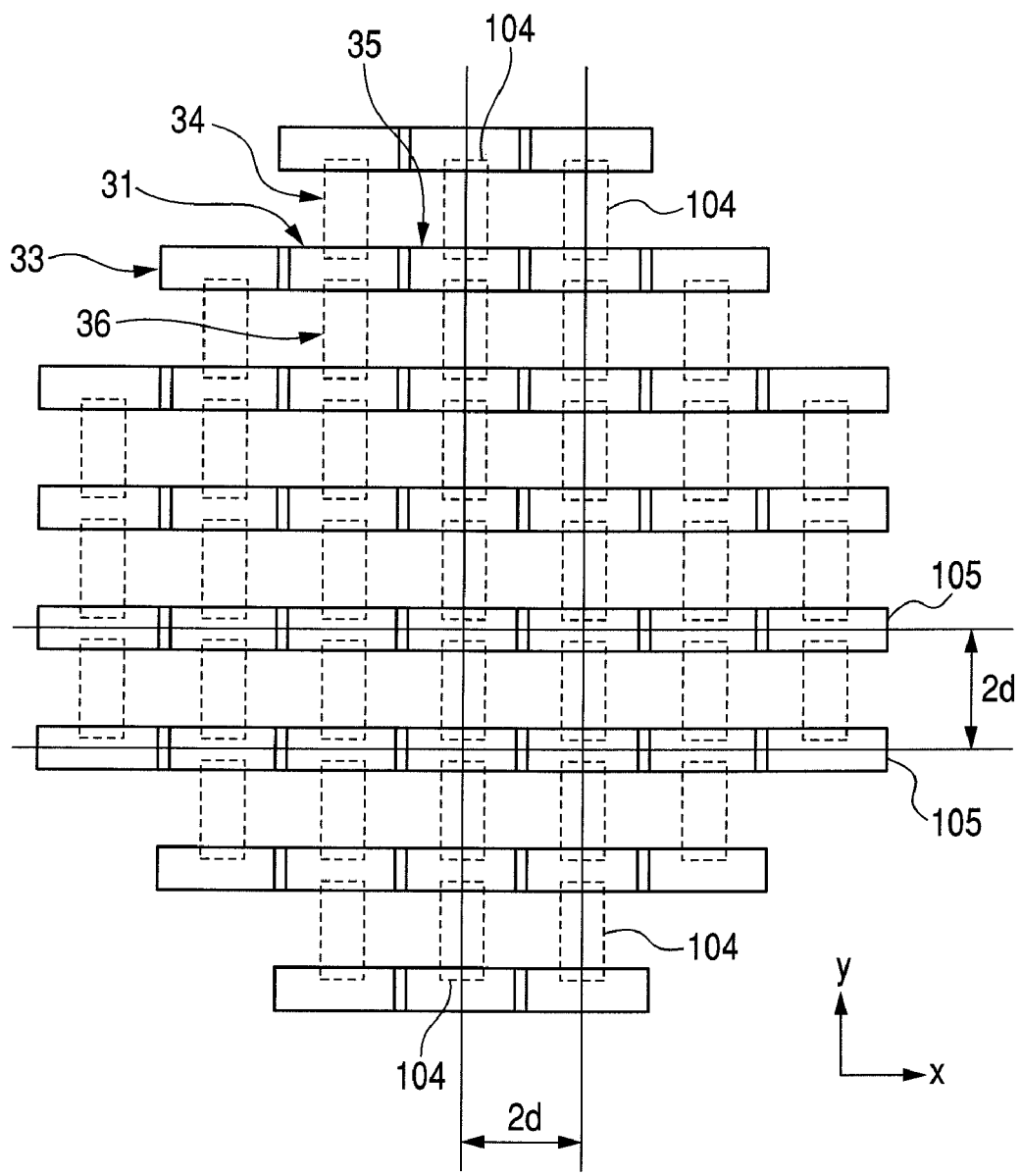
FIG. 11 is a general layout diagram of shots according to the third embodiment of the present invention.

Next, a third embodiment of the present invention is described with reference to FIGS. 9, 10, and 11.

Figure 9:
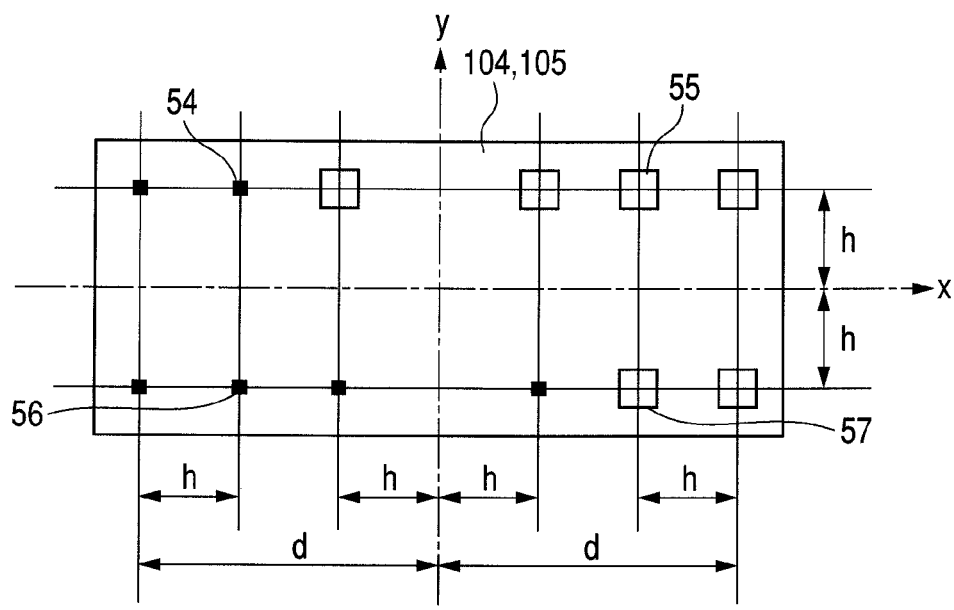
FIG. 9 is an explanatory diagram of a reticle pattern that is used in a third embodiment of the present invention.

In the third embodiment, marks 54, 55, 56, and 57 are added at locations having a distance (d−h) in the x direction from the center position of the pattern image shot 104 as illustrated in FIG. 9 with respect to the pattern image shot 100 illustrated in FIG. 2. Further, as illustrated in FIGS. 10 and 11, marks 104 transferred in the first exposure and marks 105 transferred in the second exposure are arranged so as to overlap each other. In other words, the step widths in the arrangement of the shots 104 and 105 in the x direction and the y direction are both 2d in each of the first exposure and the second exposure. Also in this case, the step widths of the shots 104 and 105 in the x direction and the y direction are 2d in each of the first exposure and the second exposure. Therefore, if the step width of the shot arrangement to be determined is the same constant value in the x direction and the y direction, data for two times can be obtained in the step width, whereby more accurate measurement and correction can be performed.

Further, compared with the case of the second embodiment, the number of shots and the number of measuring marks are decreased, whereby the time necessary for the exposure and the measurement can be shortened.

Next, a fourth embodiment of the present invention is described with reference to FIGS. 6, 12, and 13.

Figure 12:
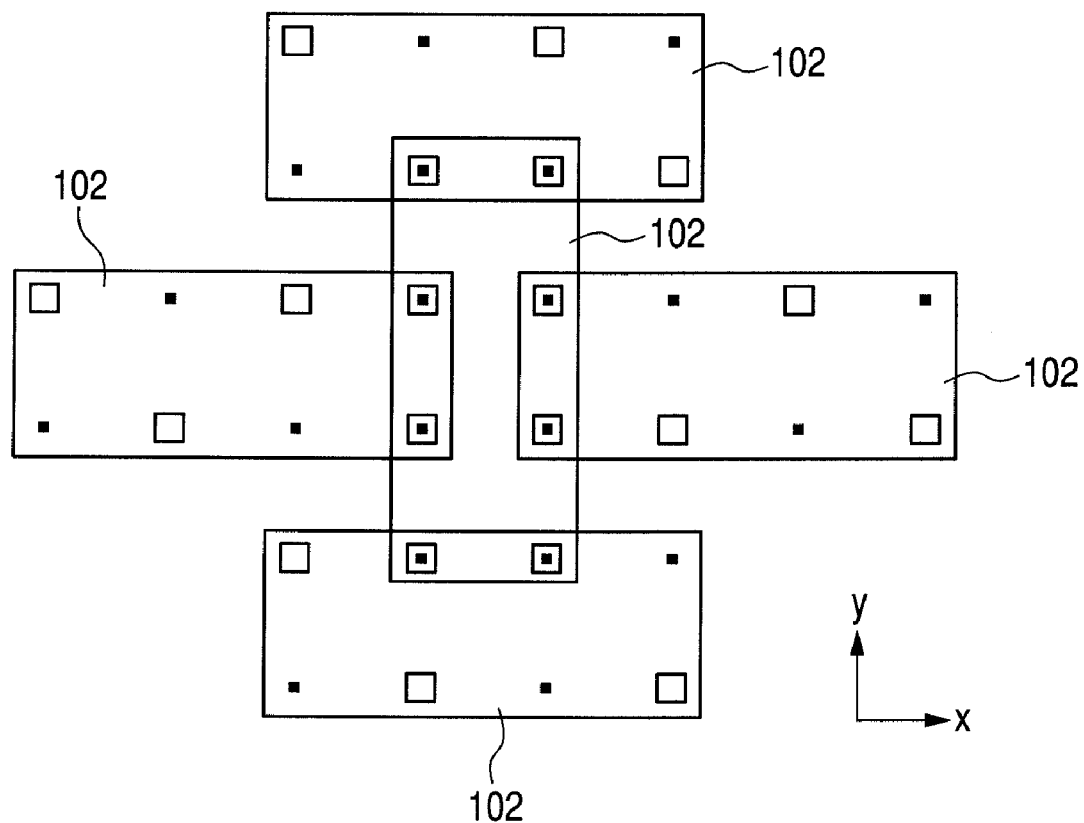
FIG. 12 is a partial enlarged diagram of a shot arrangement according to a fourth embodiment of the present invention.
Figure 13:
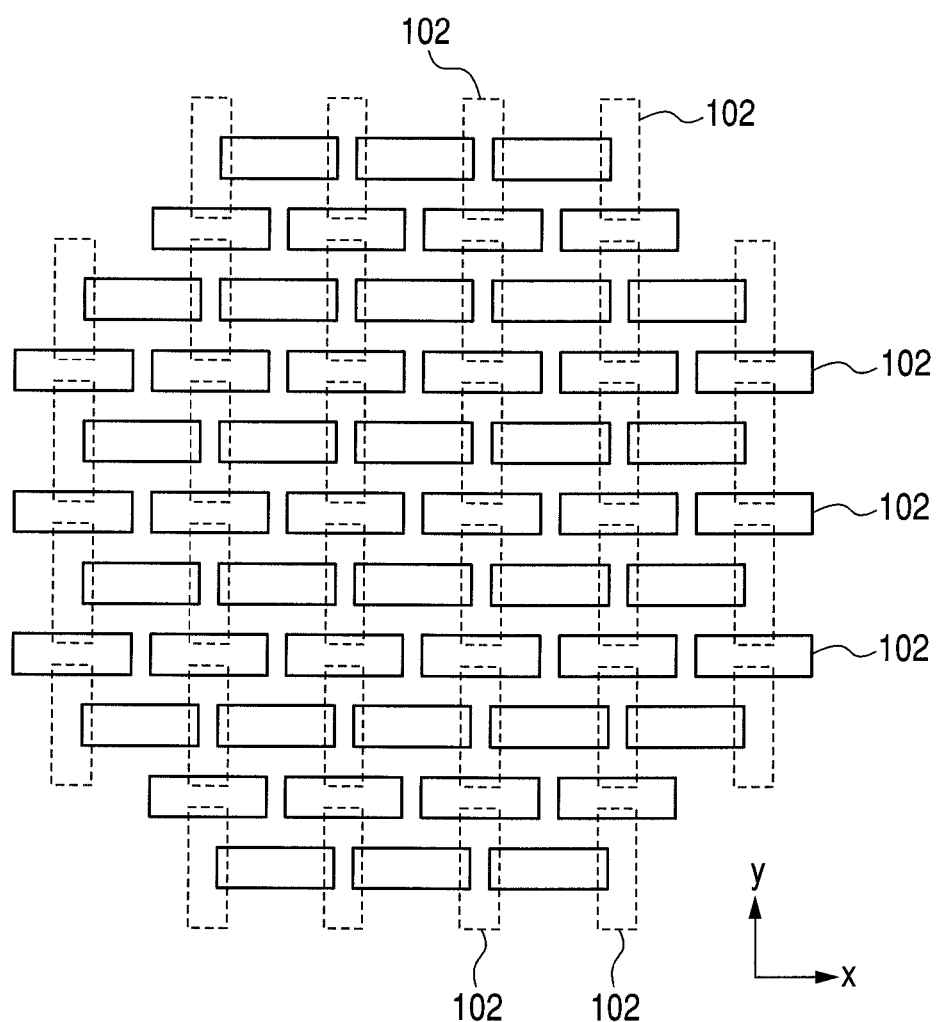
FIG. 13 is a general layout diagram of shots according to the fourth embodiment of the present invention.

In the fourth embodiment, as illustrated in FIGS. 12 and 13, a phase of the arrangement of the shots 102 in the long side direction is shifted in the second exposure by using the pattern image shot 102 illustrated in FIG. 6. In addition, this is the case where the superimposed region between the shots 102 transferred in the first exposure and the superimposed region between the shots 102 transferred in the second exposure are not formed. In this case, density of the coordinates where the shots 102 are arranged is enhanced in the long side direction of the shot 102. Therefore, it is useful when the measurement is performed in a high density shot arrangement.

Next, a fifth embodiment of the present invention is described with reference to FIG. 14.

Figure 14:
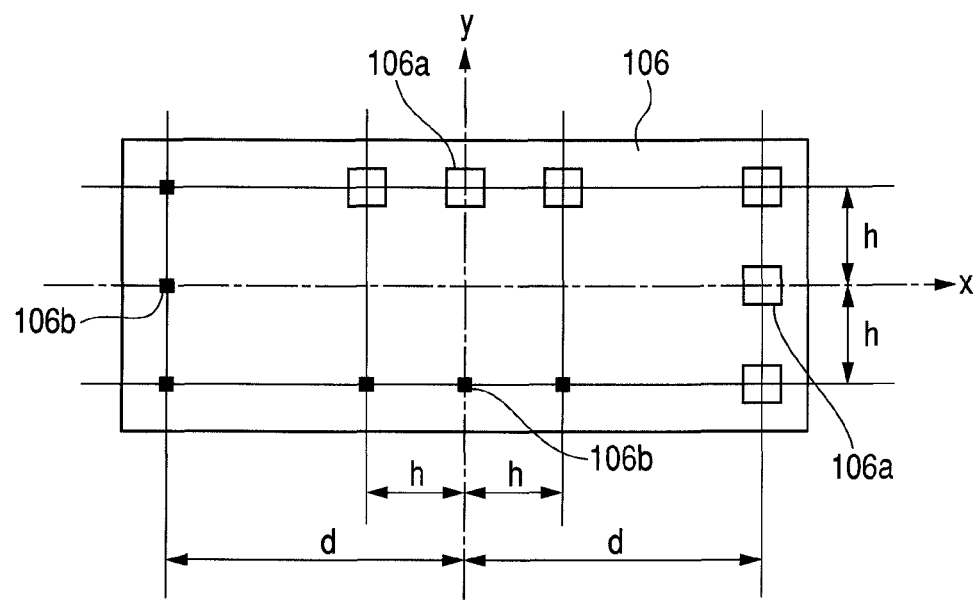
FIG. 14 is an explanatory diagram of a reticle pattern that is used in a fifth embodiment of the present invention.
Figure 15:
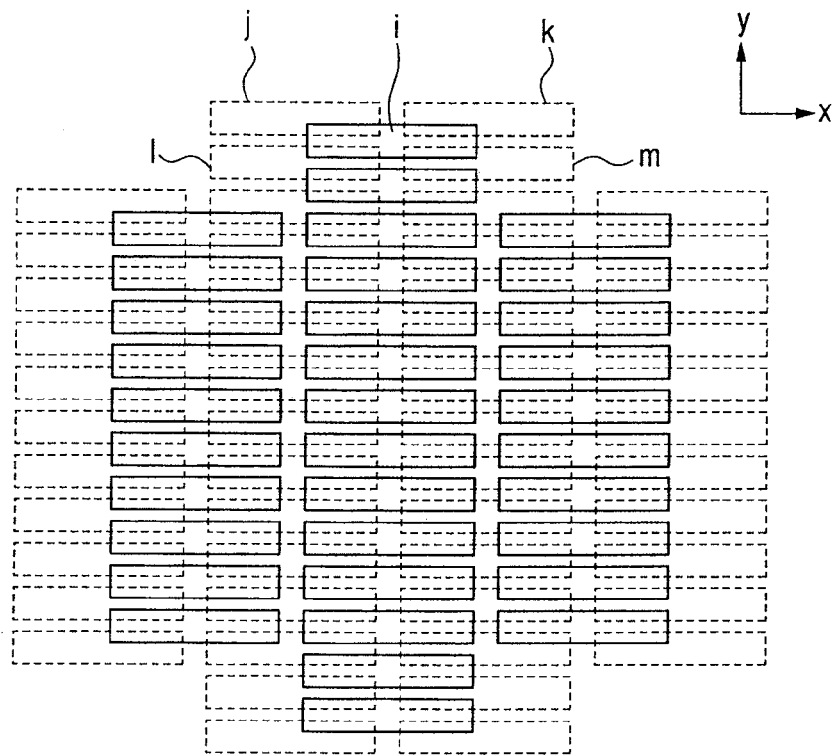
FIG. 15 is a general layout diagram of shots according to a conventional example for measuring a positional error and a rotation of the shot.
Figure 16:
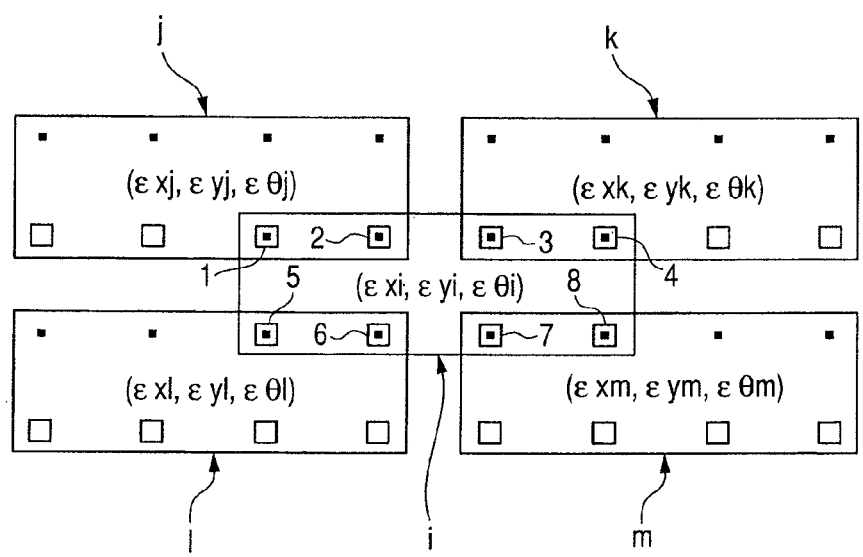
FIG. 16 is a partial enlarged diagram of a shot arrangement according to the conventional example for measuring a positional error and a rotation of the shot.

The fifth embodiment is the case where the number of marks formed in the superimposed region of a shot 106 is increased as illustrated in FIG. 14 with respect to the pattern image shot 100 illustrated in FIG. 2, i.e., the case where marks 106a and 106b are added. According to the fifth embodiment, influence of the errors when the first and the second overlap marks are measured, which include $\zeta x1(i,j)$, $\zeta x2(i,j)$, $\zeta x3(i,j)$, $\zeta x4(i,j)$, $\zeta x5(i,j)$, $\zeta x6(i,j)$, $\zeta y1(i,j)$, $\zeta y2(i,j)$, $\zeta y3(i,j)$, $\zeta y4(i,j)$, $\zeta y5(i,j)$, and $\zeta y6(i,j)$, are decreased, whereby estimation accuracy can be enhanced.

Embodiment of a Device Manufacturing Method

The device (semiconductor integrated circuit device, liquid crystal display device, or the like) can be manufactured by using the exposure apparatus of any one of the embodiments described above through the step of exposing a substrate (wafer, glass plate, or the like) onto which photosensitive agent is applied, the step of developing the substrate, and other known steps. The other known steps include etching, removing resist, dicing, bonding, packaging, and the like. According to this device manufacturing method, a device having higher quality than the conventional one can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-105837, filed Apr. 15, 2008, which is hereby incorporated by reference herein in its entirety.

What is claimed is:

1. A method of measuring precision in shot arrangement on a substrate by using an exposure apparatus for scanning an original and the substrate relatively so as to project a pattern of the original to the substrate via a projection optical system, the measuring method comprising:

a first step of transferring a measuring mark disposed on the original to the substrate at a plurality of locations;

a rotating step of moving a substrate stage which holds the substrate after performing the first step, so that the substrate is rotated by 90 degrees about a rotation axis that is parallel to an optical axis of the projection optical system;

a second step of transferring the measuring mark to the substrate at a plurality of locations after performing the rotating step, so that the measuring mark overlaps a transfer region in the first step;

a first measuring step of measuring positional deviations of first overlap marks in an overlap region where the transfer region in the first step overlaps a transfer region in the second step, the first overlap marks being overlapped between the measuring marks transferred in the first step and the measuring marks transferred in the second step; and a calculating step of calculating at least one of a positional error of a shot on the substrate, a rotational error of the same, and an orthogonality in shot arrangement based on a measurement result in the first measuring step.

2. A method according to claim 1, further comprising a second measuring step of measuring positional deviations of second overlap marks in an overlap region between the transfer regions in the one of the first step and the second step, the second overlap marks being overlapped between the measuring marks transferred in one of the first step and the second step, wherein at least one of the positional error of the shot on the substrate, the rotational error of the same, and the orthogonality in shot arrangement is calculated based on the positional deviations of the first overlap marks obtained in the first measuring step and also on the positional deviations of the second overlap marks obtained in the second measuring step.

3. A method of according to claim 1, wherein the first overlap mark includes at least one of:

an overlap between a plurality of first long side marks aligned in parallel to a long side of the transfer region in the first step and a plurality of second short side marks aligned in parallel to a short side of the transfer region in the second step; and an overlap between a plurality of first short side marks aligned in parallel to a short side of the transfer region in the first step and a plurality of second long side marks aligned in parallel to a long side of the transfer region in the second step.

4. A method according to claim 2, wherein the second overlap mark includes at least one of:

an overlap between a plurality of first short side marks aligned in parallel to a short side of the transfer region in the first step and a plurality of first short side marks of another first shot aligned in parallel to the short side so as to be opposed to the a plurality of first short side marks; and an overlap between a plurality of second short side marks aligned in parallel to a short side of the transfer region in the second step and a plurality of second short side marks of another second shot aligned in parallel to the short side so as to be opposed to the a plurality of second short side marks.

5. A method according to claim 1, wherein the substrate comprises a resist that eliminates the need for a developing step after exposure.

6. A method of adjusting of stage movement characteristics, comprising correcting movement characteristics of a substrate stage which holds the substrate based on a measurement result by the measuring method according to claim 1.

7. A method of exposing, comprising exposing a substrate held on an stage whose movement characteristics are adjusted by use of the method of adjusting of stage movement characteristics according to claim 6.

8. A method of manufacturing device, comprising:
exposing a substrate by use of the method of exposing according to claim 7;
developing the substrate; and
forming a device from the developed substrate.

* * * * *